United States Patent
Mengel (10) Patent No.: US 11,609,506 B2
(45) Date of Patent: Mar. 21, 2023

(54) SYSTEM AND METHOD FOR LATERAL SHEARING INTERFEROMETRY IN AN INSPECTION TOOL

(71) Applicant: KLA Corporation, Milpitas, CA (US)

(72) Inventor: Markus Mengel, Pleasanton, CA (US)

(73) Assignee: KLA Corporation, Milpitas, CA (US)

( * ) Notice: Subject to any disclaimer, the term of this patent is extended or adjusted under 35 U.S.C. 154(b) by 0 days.

(21) Appl. No.: 17/723,240

(22) Filed: Apr. 18, 2022

(65) Prior Publication Data
US 2022/0342325 A1    Oct. 27, 2022

Related U.S. Application Data

(60) Provisional application No. 63/177,395, filed on Apr. 21, 2021.

(51) Int. Cl.
| | | |
|---|---|---|
| *G03F 9/00* | (2006.01) | |
| *G03F 7/20* | (2006.01) | |
| *G01B 9/02098* | (2022.01) | |

(52) U.S. Cl.
CPC ....... *G03F 9/7049* (2013.01); *G01B 9/02098* (2013.01); *G03F 7/70033* (2013.01)

(58) Field of Classification Search
CPC .......................... G03F 9/7049; G03F 7/70033; G01B 9/02098
USPC ......................................................... 430/30
See application file for complete search history.

(56) References Cited

U.S. PATENT DOCUMENTS

| | | |
|---|---|---|
| 5,568,256 A | 10/1996 | Korner et al. |
| 7,187,431 B2 | 3/2007 | Kok et al. |
| 7,333,216 B2 | 2/2008 | Wegmann et al. |
| 7,760,345 B2 | 7/2010 | Manger et al. |
| 7,928,416 B2 | 4/2011 | Fomenkov |
| 8,916,831 B2 | 12/2014 | Wang |
| 9,709,811 B2 | 7/2017 | Shchemelinin et al. |

(Continued)

FOREIGN PATENT DOCUMENTS

| | | |
|---|---|---|
| WO | 9501548 A1 | 1/1995 |
| WO | 2020231867 A1 | 11/2020 |

OTHER PUBLICATIONS

International Search Report and Written Opinion in International Application No. PCT/US2022/025657 dated Aug. 3, 2022, 9 pages.

(Continued)

*Primary Examiner* — Caleen O Sullivan
(74) *Attorney, Agent, or Firm* — Suiter Swantz pc llo (57) ABSTRACT

A method for in-situ wave front detection within an inspection system is disclosed. The method includes generating light with a light source and directing the light to a stage-level reflective mask grating structure disposed on a mask stage. The method includes directing light reflected from the stage-level reflective structure to a detector-level mask structure disposed in a plane of a detector and then collecting, with an optical element, light reflected from the detector-level mask structure. The method includes forming a pupil image on the detector and laterally shifting the stage-level reflective mask, with the mask stage, across a grating period of the stage-level reflective mask grating structure to provide phase reconstruction for lateral shearing interferometry. The method includes selectively impinging light reflected from the optical element on the one or more sensors of the detector.

21 Claims, 5 Drawing Sheets

(56) References Cited

U.S. PATENT DOCUMENTS

| | | | |
|---|---|---|---|
| 10,021,773 | B2 | 7/2018 | Kuritsyn et al. |
| 11,112,691 | B2 | 9/2021 | Kvamme et al. |
| 2004/0169866 | A1 | 9/2004 | Poultney |
| 2004/0257587 | A1 | 12/2004 | Rosakis et al. |
| 2019/0049866 | A1* | 2/2019 | Huisman ................ G01D 5/266 |

OTHER PUBLICATIONS

D. Malacara, "Optical Shop Testing", John Wiley & Sons 1992, Ch. 1.

Van de Kerkhof, et al., "Full optical column characterization of DUV lithographic projection tools," Proc. SPIE 5377, Optical Microlithography XVII, (May 28, 2004); https://doi.org/10.1117/12.536331.

* cited by examiner

SYSTEM AND METHOD FOR LATERAL SHEARING INTERFEROMETRY IN AN INSPECTION TOOL

CROSS-REFERENCE TO RELATED APPLICATIONS

The present application claims the benefit under 35U.S.C. § 119(e) of U.S. Provisional Application Ser. No. 63/177,395, filed Apr. 21, 2021, which is incorporated herein by reference in the entirety.

TECHNICAL FIELD

The present disclosure relates generally to a system and method for wave front aberration detection within an imaging system and, more particularly, to a lateral shearing interferometry based wave front metrology system and method for use in an extreme ultraviolet (EUV) mask inspection tool or a deep ultraviolet wafer inspection tool.

BACKGROUND

In advanced defect inspection tools for photolithographic masks or wafers as used in a semiconductor manufacturing process, there is an emerging need for internal optical aberration control of the imaging optical systems, due to thermally induced drift or other mechanical alignment change during operation of the tool. An integral part of this control scheme is an optical aberration metrology, which owing to its permanent implementation in the tool's hardware is commonly referred to as in-situ alignment metrology'. In-situ metrologies are typically split between two different methodologies — in-situ course alignment and in-situ fine alignment. Both in-situ course alignment and in-situ fine alignment are typically based on aerial imaging of test structures on the CCD (charge coupled device) image sensor of the given inspection tool. This split between the two methodologies is necessary because metrology with high enough accuracy for fine alignment does not have adequate capture range to converge to the best alignment state from the initial alignment stage after mechanical assembly of the imaging optics.

The coarse alignment metrology method requires different structures for different aberrations and therefore only selected aberration terms are included in the alignment strategy. While this is generally supported by optical simulation, there is a risk of higher-order aberrations not being captured. While the coarse alignment metrology is designed to have sufficient dynamic range to capture the misalignment levels after mechanical assembly of the imaging optics, there remains a risk that individual assemblies might exceed that limit and cannot be aligned. Likewise, there is a risk that a final coarse alignment state is not satisfactorily within the capture range of the fine alignment method, and may converge to a false minimum. The fine alignment metrology method suffers from very low intensity levels, and therefore requires extensive measurement times. Like all image-based aberration metrologies in general, the above methods cannot strictly discriminate between amplitude and phase, and are therefore subject to errors in the illumination system or defects in photometric parameters such as coating uniformity or flare.

Therefore, there is a desire to provide a system and method to overcome the deficiencies of previous solutions.

SUMMARY

An inspection system with in-situ wave front metrology of light of the inspection system is disclosed. In embodiments, the system includes an imaging sub-system comprising a light source, a set of imaging optics, and a detector including one or more imaging sensors. In embodiments, the system includes a stage. In embodiments, a stage-level reflective mask grating structure is disposed in a plane of a mask secured by the stage, wherein the light source is configured to illuminate the stage-level reflective mask grating structure with incident light. In embodiments, the system includes a detector-level reflective mask grating structure disposed in a plane of the detector, wherein the set of imaging optics is configured to direct light reflected from the stage-level reflective structure to the detector-level mask structure. In embodiments, the system includes an optical element configured to collect light from the detector-level mask structure, wherein the detector-level mask structure is oriented to direct light from the detector-level mask structure to the optical element, wherein the optical element is configured to form a pupil image on the one or more sensors of the detector. In embodiments, the stage is configured to provide lateral shifting motion across a grating period of the stage-level reflective mask grating structure to provide phase reconstruction for lateral shearing interferometry to identify changes of the wave front of light of the imaging system. In embodiments, the system includes an actuator configured to selectively impinge light reflected from the optical element on the one or more sensors of the detector.

It is to be understood that both the foregoing general description and the following detailed description are exemplary and explanatory only and are not necessarily restrictive of the present disclosure. The accompanying drawings, which are incorporated in and constitute a part of the specification, illustrate subject matter of the disclosure. Together, the descriptions and the drawings serve to explain the principles of the disclosure

BRIEF DESCRIPTION OF DRAWINGS

The numerous advantages of the disclosure may be better understood by those skilled in the art by reference to the accompanying figures.

DETAILED DESCRIPTION

Reference will now be made in detail to the subject matter disclosed, which is illustrated in the accompanying drawings. The present disclosure has been particularly shown and described with respect to certain embodiments and specific features thereof. The embodiments set forth herein are taken to be illustrative rather than limiting. It should be readily apparent to those of ordinary skill in the art that various changes and modifications in form and detail may be made without departing from the spirit and scope of the disclosure.

For initial setup and periodic maintenance of a photomask inspection system, it is necessary to implement an image quality metrology tool for the imaging optics, that is permanently integrated into the photomask inspection system. A fundamental representation of the image quality of an imaging optics may be provided by the wave front aberration. Wavefront aberration is typically expressed in an expansion of Zernike polynomials, which describe a departure of the wave front from an ideal spherical wave at a given field point and correlate with basic image errors such as defocus, coma, astigmatism and others. Embodiments of the present disclosure are directed to an in-situ wave front metrology system for an extreme ultraviolet (EUV) mask inspection tool. The in-situ wave front metrology system of the present disclosure is based on lateral shearing interferometry (LSI) that operates at the actinic EUV wavelength of 13.5 nm.

Actinic LSI wave front metrology is advantageous as it combines a large initial capture range of the imaging optics wave front error due to coarse mechanical alignment with potentially high-end accuracy, thereby providing capability to replace multiple complementary aerial image-based metrologies with a single metrology method. Additionally, the LSI wave front metrology of the present disclosure is faster than aerial imaging because only one structure needs to be scanned and integration times are shorter due to non-critical light budget. Embodiments of the present disclosure may also provide higher absolute accuracy than aerial imaging in the case of illumination defects since LSI discriminates between intensity and phase. In contrast to aerial imaging, all Zernike coefficients up to ~Z36 can be measured with high capture range, thereby mitigating risk of 'blind spots' in the optical setup process. If only certain Zernike coefficients are needed, the phase shifting and wave front reconstruction algorithm can be optimized and accelerated so to potentially track drift, such as, but not limited to, heating induced performance drift.

Additional embodiments of the present disclosure are directed to wave front metrology of wafer inspection systems with high numerical aperture in the deep ultraviolet (DUV) in the wavelength range 190 - 270 nm.

Figure 1:
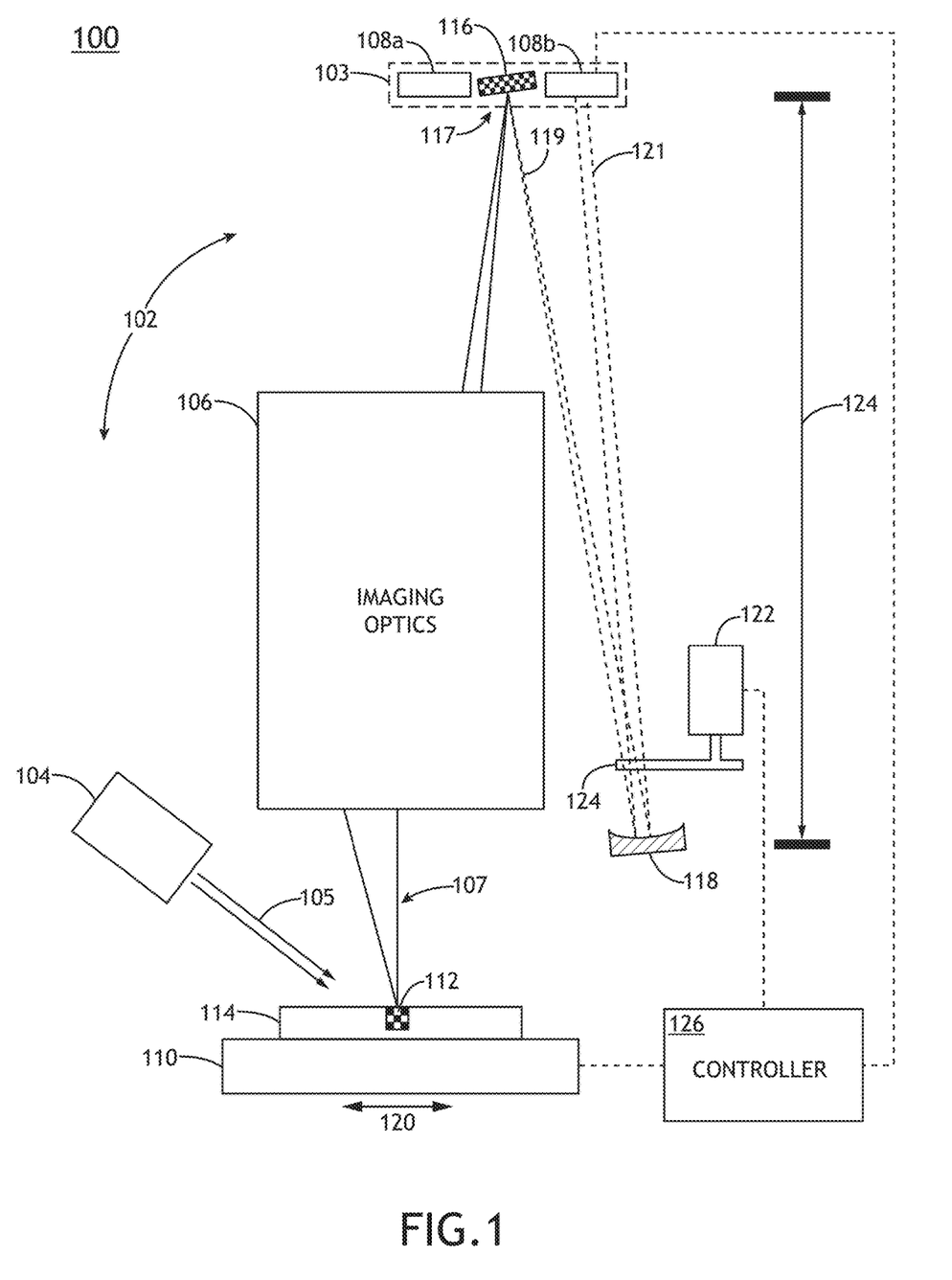
FIG. 1 illustrates a simplified block diagram of an EUV inspection system with in-situ lateral shearing interferometry capabilities, in accordance with one or more embodiments of the present disclosure.

FIG. 1 illustrates an inspection system 100 equipped with in-situ wavefront metrology capabilities, in accordance with one or more embodiments of the present disclosure. In embodiments, the inspection system 100 is configured as a photomask inspection system operating in the EUV wavelength regime (e.g., 13.5 nm). In embodiments, the inspection system 100 includes an imaging sub-system 102. The imaging sub-system 102 may be configured to perform functions associated with the inspection of the mask 114 as well as functions associated with in-situ wavefront metrology. In embodiments, and discussed further herein, the mode of the inspection system 100 may be switched between i) normal inspection mode; and ii) wave front detection mode.

The imaging sub-system 102 may include, but is not limited to, an EUV light source 104, a set of EUV imaging optics 106, and one or more detectors 103 including one or more sensors 108a, 108b. It is noted that the EUV light source 104, the set of EUV imaging optics 106, and the one or more detectors 103 may include any EUV light source 104, EUV imaging optics 106, and detectors 103 known in the art of EUV-based inspection. U.S. Pat. No. 8,916,831, issued on Dec. 23, 2014, and U.S. Pat. No. 11,112,691, issued on Sep. 7, 2021, generally discuss EUV-based inspection, which are incorporated herein by reference in the entirety. Light for generating EUV sources are generally discussed in U.S. Pat. No. 7,928,416B2, issued on Apr. 19, 2011; U.S. Pat. No. 9,709,811, issued on Jul. 18, 2017; and U.S. Pat. No. 10,021,773, issued on Jul. 10, 2018, which are incorporated herein by reference in the entirety.

In embodiments, the inspection system 100 includes a mask stage 110 configured to secure the mask 114. In embodiments, the inspection system 100 includes a stage-level reflective mask grating structure 112 disposed in a plane of the mask 114 as it is secured by the mask stage 110. In embodiments, the inspection system 100 includes a detector-level reflective mask grating structure 116 disposed in a plane of the detector 108. The light source 104 is configured to illuminate the stage-level reflective mask grating structure 112 with incident light 105. In turn, the set of imaging optics 106 is configured to direct light beam 107 reflected from the stage-level reflective structure 112 to the detector-level mask structure 116.

Figure 2:
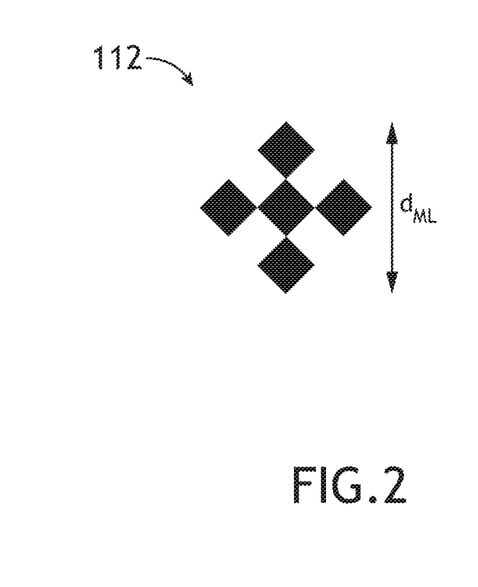
FIG. 2 illustrates a top-level view of a mask-level reflective grating structure, in accordance with one or more embodiments of the present disclosure.
Figure 3:
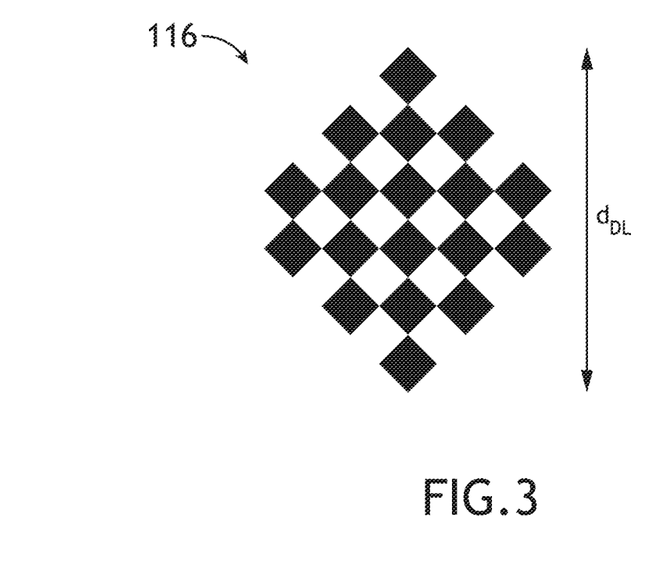
FIG. 3 illustrates a top-level view of a detector-level reflective grating structure, in accordance with one or more embodiments of the present disclosure.

FIG. 2 illustrates a top-level view of the stage-level reflective mask grating structure 112 and FIG. 3 illustrates a top-level view of the detector-level reflective mask grating structure 116. It is noted that the embodiments of the present disclosure are not limited to the specific examples provide in FIGS. 2 and 3 and it is contemplated that numerous grating structure arrangements may be implemented within system 100.

In embodiments, the stage-level mask grating structure 112 may be illuminated with the full NA of the imaging sub-system 102. The stage-level reflective mask grating structure 112 may include, but is not limited to, a checkerboard grating design intended to generate coherent diffracted copies (1st order) of the incident incoherent light NA. For the diffraction angle to be a reasonably small fraction of the tool NA (typically a few per cent), the periodicity of the grating (along the patch diagonal) may be on the order of a micrometer, according to the diffraction equation with the EUV wavelength of 13.5 nm. For the 3x3 mask size in this example, this would lead to a structure size ($d_{ML}$) of several µm, with about 55% reflection duty cycle. It is noted that this is a very large reflective area compared to the test structures that are being used for aerial imaging metrologies. This area could be increased by using a mask with more squares (e.g., 4x4, 5x5, NxM), and consequently more light could be collected for wave front metrology.

In embodiments, the detector-level reflective mask grating structure 116 may be positioned within a free area 117 of the sensor plane (e.g., CCD plane) of the one or more sensors 108a, 108b of the one or more detectors 103. The detector-level reflective mask grating structure 116 may include an extended checkerboard grating, with more reflective squares than the mask-level grating structure 112. In embodiments, the size of detector- level reflective mask structure 116 ($d_{DL}$) is larger than the size of the mask-level reflective mask structure 116, $d_{ML}$. Such an arrangement ensures overlap with the projected image of the mask-level reflective mask grating structure 116 in multiple laterally-shifted positions of up to one period in each direction. In embodiments, the grating pitch of the detector-level reflective mask grating structure 116 may be upscaled by the magnification ratio of the imaging optics 108, resulting in aerial coverage of several millimeters across.

It is noted that since only one mask-level structure (e.g., checkerboard structure) is needed in system 100, the available space on the mask stage can be filled with identical redundant markers and extend the contamination limited life time of the metrology.

In embodiments, the inspection system 100 includes a mirror 118 configured to collect light beam 119 from the detector-level mask structure 116. The detector-level mask structure 116 may be oriented to direct light from the detector-level mask structure 116 to the mirror 118. In turn, the mirror is configured to reflect light beam 121 collected by the mirror 118 to the one or more-sensors of the detector 103 to form a pupil image on the one or more sensors of the detector 108. For example, the detector-level reflective mask grating structure 116 may be slightly tilted to point the light beam 119 from the structure 116 onto mirror 118. In embodiments, the mirror 118 is laterally located near the lower end of the EUV imaging sub-system102 at a distance that constitutes the track length 124 of the interferometer.

The diffraction from the detector-level reflective mask grating structure 116 may create +/−1st order diffracted pupil beams that will coincide with the $0^{th}$ order to create the static shearing interferogram on the sensors (e.g., CCD) of the detector 108. The formation of a static shearing interferogram is described generally in U.S. Pat. No. 7,333,216 B2, issued on Feb. 19, 2008, which is incorporated herein by reference in the entirety.

In embodiments, the mirror 118 may include a spherical mirror. For example, a spherical mirror with a focal length of the indicated track length (i.e., a radius curvature of 2× track length) will create a corrected pupil image via optical 2f transformation. The transformation will generate the pupil image with a diameter of a few hundred micrometer on one of the sensors (e.g., CCDs) of the detector 103 on which it is aligned to project. This occurs regardless of the illuminated field size of several millimeter since the relation of track length vs. field size fulfills the paraxial condition for a spherical lens element. For example, given the typical pixel size of a CCD, a sufficient number of pixels will be covered by the pupil image projection to generate a digital sampling of the system wave front with resolution on the order of the shearing distance, which is a small fraction of the pupil diameter. It is noted that system 100 is not limited to the mirror 118 discussed herein and it is contemplated that the system 100 may incorporate any optical element capable of carrying out the functions of mirror 118. For example, the optical element may include any combination of refractive optics (e.g., lenses, prisms), reflective optics (e.g., mirrors), or diffractive optics (e.g., diffraction gratings) suitable for collecting and/or directing light as described herein.

In embodiments, the mask stage 110 is configured to provide lateral shifting motion 120 across a grating period of the stage-level reflective mask grating structure 112 to provide phase reconstruction for lateral shearing interferometry to identify changes of the wave front of light of the inspection system 100. It is noted that the lateral shifting motion about one period of the grating period provides for high fidelity phase reconstruction, which may be achieved with the mask stage 110. Phase reconstruction is described generally in D. Malacara, "Optical Shop Testing", John Wiley & Sons 1992, Ch. 1, which is incorporated herein by reference in the entirety. The stage 110 has sufficient accuracy on the order of nanometers in the full 3D space to provide a precise in-plane phase stepping motion curve over the grating period. In embodiments, no stage motion of the grating mirror in the CCD plane of the detector 103 is required.

In embodiments, the mask stage 110 is controlled via controller 126. In this sense, the controller 126 is communicatively coupled to the mask stage 110 and is configured to transmit control instructions to the mask stage 110 in order to control the motion of the mask stage 110 to carry out the lateral shift described herein. In embodiments, the controller 126 is also communicatively coupled to the detector 103 so as to analyze the image data in correlation to the laterally shifted mask stage position. The controller 126 may include processors and memory to carry out these control functions.

An estimate of the light intensity at the CCD can be performed by comparison with the normal mode of operation. The reflective part of the 5-field mask in FIG. 2 would have a size of several square micrometers, which corresponds to a projected image size on the CCD of several square millimeters. However, the projected pupil after reflection from the detector-level mask grating structure 116 and the spherical 2f mirror 118 back onto the CCD sensor would compress the light into a circle with less than one square millimeter area. Therefore, even with a reflectivity loss from two mirrors there would still be more photons per pixel of the CCD than in normal operation. It is noted that the detector 103 is not limited to a CCD detector and may include any type of detector known in the art suitable for imaging collected light from the mirror 118. For example, the detector 118 may include, but is not limited to, a CCD detector, a TDI detector, a CMOS image sensor, or the like.

In embodiments, the inspection system 100 includes an actuator 122 configured to selectively impinge light 121 reflected from the mirror 118 on the one sensors 108a, 108b of the detector 103. As shown in FIG. 1, the actuator 122 may include a shutter 124 positioned optically between the detector-level reflective mask grating structure 116 and the one or more sensors 108a, 108b of the detector 103 to i) block a reflected pattern from a beam path during normal inspection mode; and ii) pass through light during wave front detection mode. In alternative and/or additional embodiments, the actuator 122 includes a tilting mechanism configured to tilt the mirror 118 such that light reflected from the mirror 118 impinges on the one or more sensors 108a, 108b of the detector 103 during wave front detection mode and tilt the mirror such that light reflected from the mirror from fails to impinge on the one or more sensors 108a, 108b of the detector 103 during normal inspection mode.

In embodiments, the actuator 122 is controlled via controller 126. In this sense, the controller 126 is communicatively coupled to the actuator 122 and is configured to transmit control instructions to the actuator 122 in order to control the state of the actuator 122. For example, in the case of a shutter, the controller 126 may transmit control instructions to the actuator that causes the actuator 122 to open/close the shutter 124, thereby switching the mode of system 100 between i) normal operation mode and ii) wave front detection mode. For example, in the case of a tilt actuator, the controller 126 may transmit control instructions to the actuator that causes the actuator 122 to rotate or tilt a stage securing the mirror 118, thereby causing the light 121 to rotate off/on the sensors 108a, 108b of detector 103 and, thus, switching the mode of system 100 between i) normal operation mode and ii) wave front detection mode.

It is noted that, while much of the present disclosure has focused LSI-based wave front detection in the context of an EUV mask inspection system, this configuration is not a limitation on the scope of the present disclosure. Rather, the scope of the present disclosure is intended to extend to any inspection system configuration. For example, in additional embodiments, the system 100 may include a DUV wafer inspection tool equipped with LSI-based wave front metrology capabilities.

While the above dimensions of mask and grating structures depicted in FIGS. 2 and 3 are permitted to vary over a certain range, depending on the exact optical parameters of the imaging system, the metrology system cannot be simply extended to the much longer wavelengths of the DUV region (e.g., 193 nm or 266 nm) without changes to the optical parameters. The wavelengths of the DUV region are 15-20 times larger than that of EUV, and therefore the size of the detector-level mask structure 116 would need to increase to a size that could no longer fit into the available space between the CCDs of the detector 108.

Nevertheless, it is possible to apply the solution to a DUV wafer inspection system due to two factors which both together can sufficiently reduce the size of the grating structures. First, the NA of a wafer inspection microscope is typically much larger than the NA of the EUV mask inspection tool, leading to correspondingly smaller grating pitch for a given shearing distance. Second, the wafer inspection optics of a DUV tool are typically scalable to smaller magnification via an optical transfer element with variable magnification ratio.

Figure 4:
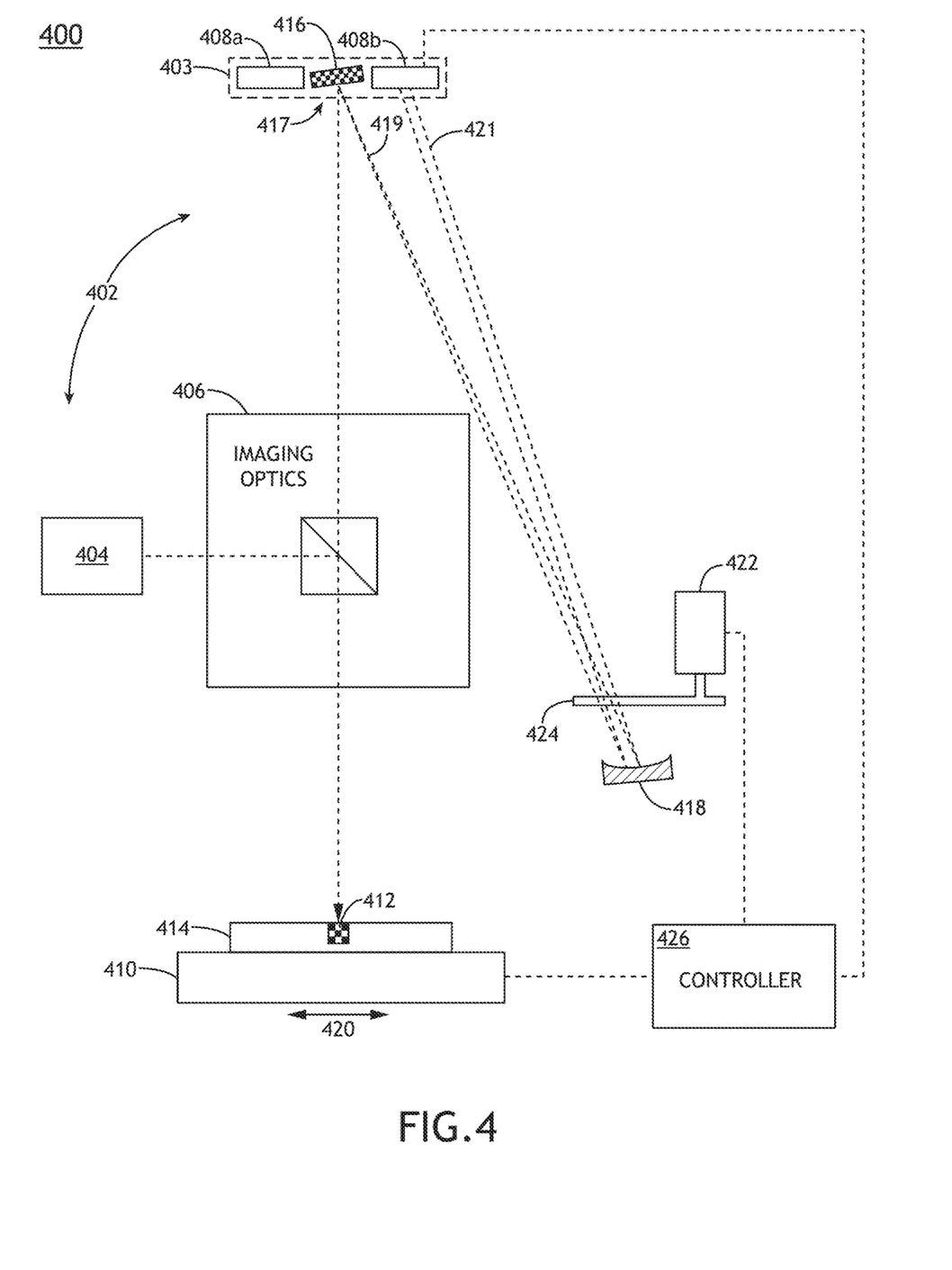
FIG. 4 illustrates a simplified block diagram of a DUV inspection system with in-situ lateral shearing interferometry capabilities, in accordance with one or more embodiments of the present disclosure.

FIG. 4 illustrates a DUV wafer inspection system 400 equipped with in-situ wavefront metrology capabilities, in accordance with one or more embodiments of the present disclosure. It is noted that all embodiments, components, and steps described previously herein with respect to system 100 should be interpreted to extend to system 400 unless otherwise noted.

In embodiments, the inspection system 400 is configured as a wafer inspection system operating in the DUV wavelength regime (e.g., e.g., 193 nm or 266 nm). In embodiments, the inspection system 400 includes an imaging sub-system 402. The imaging sub-system 402 may be configured to perform functions associated with the inspection of the wafer 414 as well as functions associated with in-situ wavefront metrology. The imaging sub-system 402 may include, but is not limited to, a DUV light source 404, a set of DUV imaging optics 406, and one or more detectors 403 including one or more sensors 408a, 408b.

In embodiments, the inspection system 400 includes a wafer stage 410 configured to secure the wafer 414. In embodiments, the inspection system 400 includes a stage-level reflective mask grating structure 412 disposed in a plane of the wafer 414 as it is secured by the wafer stage 410. In embodiments, the inspection system 100 includes a detector-level reflective mask grating structure 416 disposed in a plane of the detector 403. The light source 404 is configured to illuminate the stage-level reflective mask grating structure 412 with incident light. In turn, the set of imaging optics 406 is configured to direct light beam reflected from the stage-level reflective structure 412 to the detector-level mask structure 416. In embodiments, the detector-level reflective mask grating structure 416 may be positioned within a free area 417 of the sensor plane (e.g., CCD plane) of the one or more sensors 408a, 408b of the one or more detectors 403.

In embodiments, the inspection system 400 includes a mirror 418 configured to collect light beam 419 from the detector-level mask structure 416. The detector-level mask structure 416 may be oriented to direct light from the detector-level mask structure 116 to the mirror 418. In turn, the mirror 418 is configured to reflect light beam 421 collected by the mirror 418 to the one or more-sensors 408a, 408b of the detector 403 to form a pupil image on the one or more sensors of the detector 403. The detector-level reflective mask grating structure 416 may be slightly tilted to point the light beam 419 from the structure 416 onto mirror 418. In embodiments, the mirror 418 may include a spherical mirror. It is noted that system 400 is not limited to the mirror 418 discussed herein and it is contemplated that the system 400 may incorporate any optical element capable of carrying out the functions of mirror 418. For example, the optical element may include any combination of refractive optics (e.g., lenses, prisms), reflective optics (e.g., mirrors), or diffractive optics (e.g., diffraction gratings) suitable for collecting and/or directing light as described herein.

In embodiments, the wafer stage 410 is configured to provide lateral shifting motion 420 across a grating period of the stage-level reflective mask grating structure 412 to provide phase reconstruction for lateral shearing interferometry to identify changes of the wave front of light of the inspection system 400. In embodiments, the wafer stage 410 is controlled via controller 426.

In embodiments, the inspection system 400 includes an actuator 422 configured to selectively impinge light 421 reflected from the mirror 418 on the one sensors 408a, 408b of the detector 403. As shown in FIG. 4, the actuator 422 may include a shutter 424 positioned optically between the detector-level reflective mask grating structure 416 and the one or more sensors 408a, 408b of the detector 403 to i) block a reflected pattern from a beam path during normal inspection mode; and ii) pass through light during wave front detection mode. In alternative and/or additional embodiments, the actuator 422 includes a tilting mechanism configured to tilt the mirror 418 such that light reflected from the mirror 418 impinges on the one or more sensors 408a, 408b of the detector 403 during wave front detection mode and tilt the mirror such that light reflected from the mirror from fails to impinge on the one or more sensors 408a, 408b of the detector 403 during normal inspection mode. In embodiments, the actuator 422 is controlled via controller 426.

Figure 5:
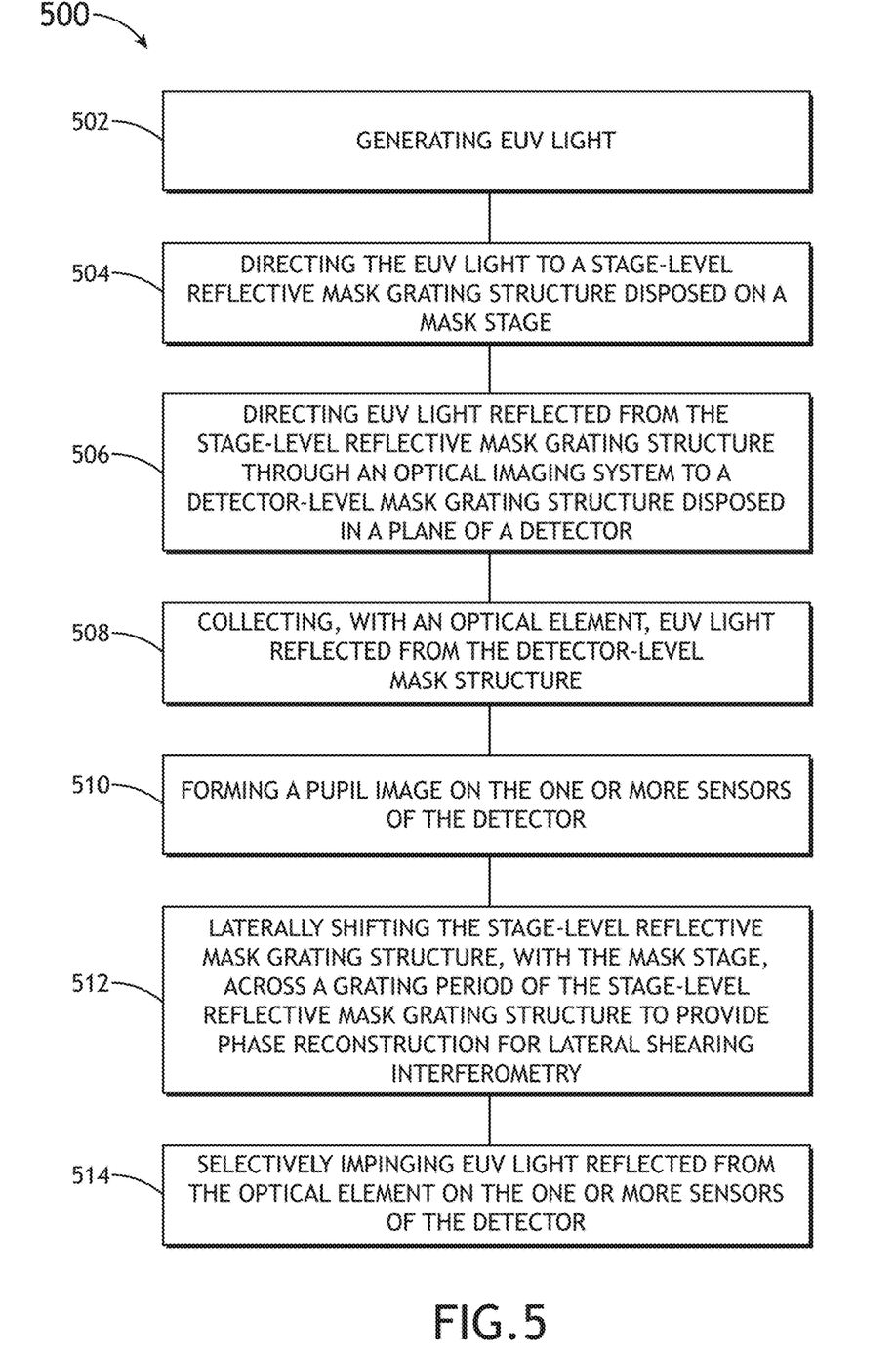
FIG. 5 illustrates a flow diagram of a method of in-situ lateral shearing interferometry capabilities within a photomask inspection system, in accordance with one or more embodiments of the present disclosure.

FIG. 5 illustrates a flow diagram of a method of in-situ wave front metrology in a photomask inspection system, in accordance with one or more embodiments of the present disclosure.

In step 502, light is generated. For example, EUV light may be generated by an EUV light source. In step 504, the light is directed to a stage-level reflective mask grating disposed on a mask stage. In step 506, light reflected from the stage-level reflective structure is directed to a detector-level mask structure disposed in a plane of one or more sensors of a detector. In step 508, light reflected from the detector-level mask structure is collected with an optical element. In step 510, a pupil image is formed on the one or more sensors of the detector. In step 512, the stage-level reflective mask is laterally shifted, with the mask stage, across a grating period of the stage-level reflective mask grating structure to provide phase reconstruction for lateral shearing interferometry to identify changes of the wave front of the light of the photomask inspection system. In step 514, light reflected from the optical element is selectively impinged on the one or more sensors of the detector.

Figure 6:
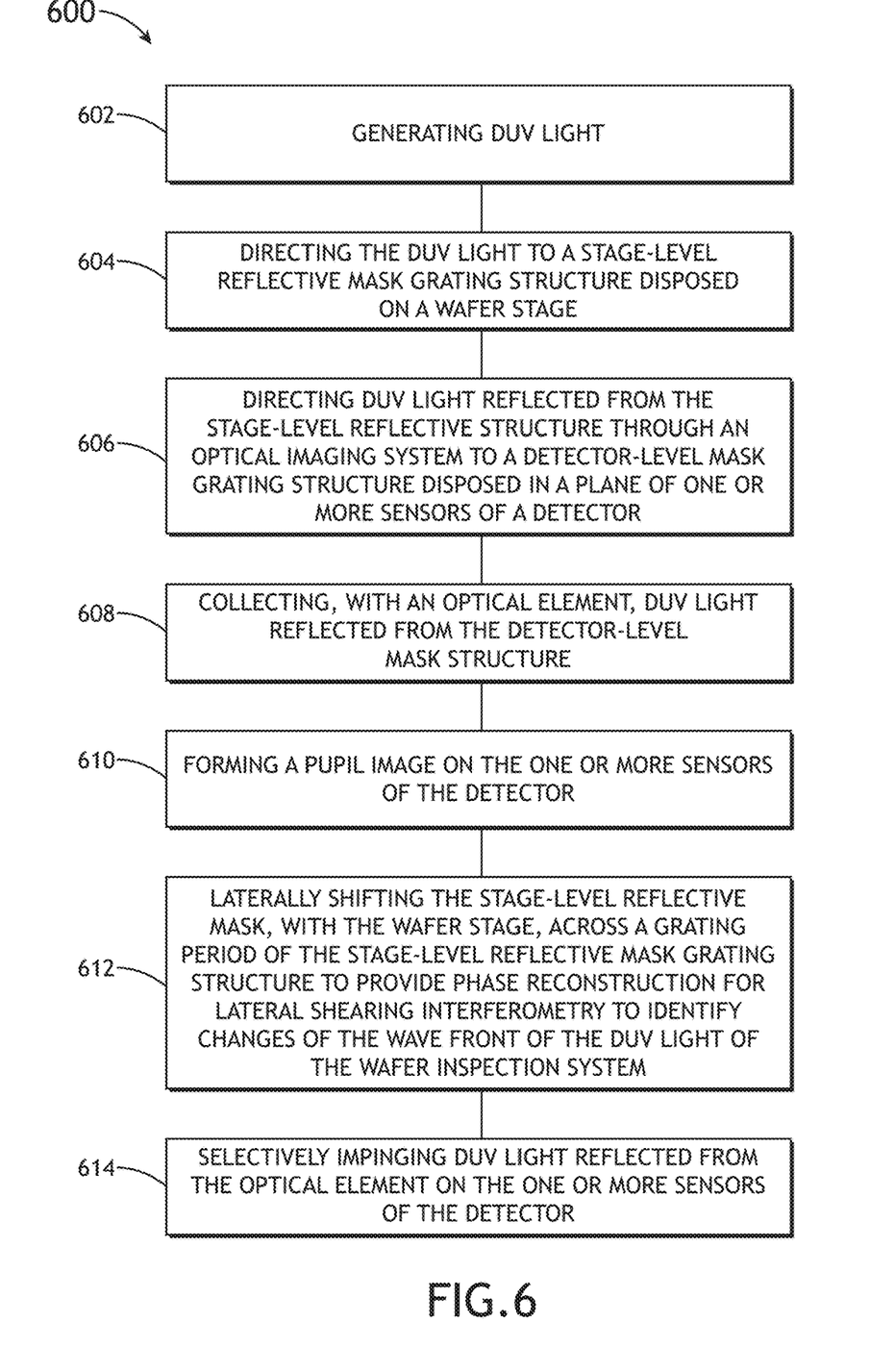
FIG. 6 illustrates a flow diagram of a method of in-situ lateral shearing interferometry capabilities within a wafer inspection system, in accordance with one or more embodiments of the present disclosure

FIG. 6 illustrates a flow diagram of a method of in-situ wave front metrology in a wafer inspection system, in accordance with one or more embodiments of the present disclosure.

In step 602, light is generated. For example, DUV light may be generated by a DUV light source. In step 604, the light is directed to a stage-level reflective mask grating disposed on a wafer stage. In step 606, light reflected from the stage-level reflective structure is directed to a detector-level mask structure disposed in a plane of one or more sensors of a detector. In step 608, light reflected from the detector-level mask structure is collected with an optical element. In step 610, a pupil image is formed on the one or more sensors of the detector. In step 612, the stage-level reflective mask is laterally shifted, with the wafer stage, across a grating period of the stage-level reflective mask grating structure to provide phase reconstruction for lateral shearing interferometry to identify changes of the wave front of the light of the wafer inspection system. In step 614, light reflected from the optical element is selectively impinged on the one or more sensors of the detector.

It is further contemplated that each of the embodiments of the method described above may include any other step(s) of any other method(s) described herein. In addition, each of the embodiments of the method described above may be performed by any of the systems described herein.

Referring again to FIG. 1, in embodiments, the controller 126 includes one or more processors and memory. The one or more processors may include any processor or processing element known in the art. For the purposes of the present disclosure, the term "processor" or "processing element" may be broadly defined to encompass any device having one or more processing or logic elements (e.g., one or more micro- processor devices, one or more application specific integrated circuit (ASIC) devices, one or more field programmable gate arrays (FPGAs), or one or more digital signal processors (DSPs)). In this sense, the one or more processors may include any device configured to execute algorithms and/or instructions (e.g., program instructions stored in memory). In embodiments, the one or more processors may be embodied as a desktop computer, mainframe computer system, workstation, image computer, parallel processor, networked computer, or any other computer system configured to execute a program configured to operate or operate in conjunction with the system 100, as described throughout the present disclosure. Further, the steps described throughout the present disclosure may be carried out by a single controller or, alternatively, multiple controllers. Additionally, the controller 126 may include one or more controllers housed in a common housing or within multiple housings. In this way, any controller or combination of controllers may be separately packaged as a module suitable for integration into system 100. Further, the controller 126 may analyze data received from the detector 103 and feed the data to additional components within the system 100 or external to the system 100.

The memory medium may include any storage medium known in the art suitable for storing program instructions executable by the associated one or more processors. For example, the memory medium may include a non-transitory memory medium. By way of another example, the memory medium may include, but is not limited to, a read-only memory (ROM), a random-access memory (RAM), a magnetic or optical memory device (e.g., disk), a magnetic tape, a solid-state drive and the like. It is further noted that memory medium may be housed in a common controller housing with the one or more processors. In one embodiment, the memory medium may be located remotely with respect to the physical location of the one or more processors. For instance, the one or more processors may access a remote memory (e.g., server), accessible through a network (e.g., internet, intranet and the like).

One skilled in the art will recognize that the herein described components operations, devices, objects, and the discussion accompanying them are used as examples for the sake of conceptual clarity and that various configuration modifications are contemplated. Consequently, as used herein, the specific exemplars set forth and the accompanying discussion are intended to be representative of their more general classes. In general, use of any specific exemplar is intended to be representative of its class, and the non-inclusion of specific components, operations, devices, and objects should not be taken as limiting.

With respect to the use of substantially any plural and/or singular terms herein, those having skill in the art can translate from the plural to the singular and/or from the singular to the plural as is appropriate to the context and/or application. The various singular/plural permutations are not expressly set forth herein for sake of clarity.

The herein described subject matter sometimes illustrates different components contained within, or connected with, other components. It is to be understood that such depicted architectures are merely exemplary, and that in fact many other architectures can be implemented which achieve the same functionality. In a conceptual sense, any arrangement of components to achieve the same functionality is effectively "associated" such that the desired functionality is achieved. Hence, any two components herein combined to achieve a particular functionality can be seen as "associated with" each other such that the desired functionality is achieved, irrespective of architectures or intermedial components. Likewise, any two components so associated can also be viewed as being "connected," or "coupled," to each other to achieve the desired functionality, and any two components capable of being so associated can also be viewed as being "couplable," to each other to achieve the desired functionality. Specific examples of couplable include but are not limited to physically mateable and/or physically interacting components and/or wirelessly interactable and/or wirelessly interacting components and/or logically interacting and/or logically interactable components.

Furthermore, it is to be understood that the invention is defined by the appended claims. It will be understood by those within the art that, in general, terms used herein, and especially in the appended claims (e.g., bodies of the appended claims) are generally intended as "open" terms (e.g., the term "including" should be interpreted as "including but not limited to," the term "having" should be interpreted as "having at least," the term "includes" should be interpreted as "includes but is not limited to," and the like). It will be further understood by those within the art that if a specific number of an introduced claim recitation is intended, such an intent will be explicitly recited in the claim, and in the absence of such recitation no such intent is present. For example, as an aid to understanding, the following appended claims may contain usage of the introductory phrases "at least one" and "one or more" to introduce claim recitations. However, the use of such phrases should not be construed to imply that the introduction of a claim recitation by the indefinite articles "a" or "an" limits any particular claim containing such introduced claim recitation to inventions containing only one such recitation, even when the same claim includes the introductory phrases "one or more" or "at least one" and indefinite articles such as "a" or "an" (e.g., "a" and/or "an" should typically be interpreted to mean "at least one" or "one or more"); the same holds true for the use of definite articles used to introduce claim recitations. In addition, even if a specific number of an introduced claim recitation is explicitly recited, those skilled in the art will recognize that such recitation should typically be interpreted to mean at least the recited number (e.g., the bare recitation of "two recitations," without other modifiers, typically means at least two recitations, or two or more recitations). Furthermore, in those instances where a convention analogous to "at least one of A, B, and C, and the like" is used, in general such a construction is intended in the sense one having skill in the art would understand the convention (e.g., " a system having at least one of A, B, and C" would include but not be limited to systems that have A alone, B alone, C alone, A and B together, A and C together, B and C together, and/or A, B, and C together, and the like). In those instances where a convention analogous to "at least one of A, B, or C, and the like" is used, in general such a construction is intended in the sense one having skill in the art would understand the convention (e.g., " a system having at least one of A, B, or C" would include but not be limited to systems that have A alone, B alone, C alone, A and B together, A and C together, B and C together, and/or A, B, and C together, and the like). It will be further understood by those within the art that virtually any disjunctive word and/or phrase presenting two or more alternative terms, whether in the description, claims, or drawings, should be understood to contemplate the possibilities of including one of the terms, either of the terms, or both terms. For example, the phrase "A or B" will be understood to include the possibilities of "A" or "B" or "A and B."

It is believed that the present disclosure and many of its attendant advantages will be understood by the foregoing description, and it will be apparent that various changes may be made in the form, construction and arrangement of the components without departing from the disclosed subject matter or without sacrificing all of its material advantages. The form described is merely explanatory, and it is the intention of the following claims to encompass and include such changes. Furthermore, it is to be understood that the invention is defined by the appended claims

What is claimed:

1. An inspection system with in-situ wavefront metrology of light of the inspection system comprising:
    an imaging sub-system comprising a light source, a set of imaging optics, and a detector including one or more imaging sensors;
    a stage;
    a stage-level reflective mask grating structure disposed in a plane of a mask secured by the stage, wherein the light source is configured to illuminate the stage-level reflective mask grating structure with incident light;
    a detector-level reflective mask grating structure disposed in a plane of the detector, wherein the set of imaging optics is configured to direct light reflected from the stage-level reflective structure to the detector-level mask structure;
    an optical element configured to collect light from the detector-level mask structure, wherein the detector-level mask structure is oriented to direct light from the detector-level mask structure to the optical element, wherein the optical element is configured to form a pupil image on the one or more sensors of the detector, wherein the stage is configured to provide lateral shifting motion across a grating period of the stage-level reflective mask grating structure to provide phase reconstruction for lateral shearing interferometry to identify changes of the wave front of light of the imaging system; and
    an actuator configured to selectively impinge light reflected from the optical element on the one or more sensors of the detector.

2. The system of claim 1, wherein the light source is configured to generate extreme ultraviolet (EUV) light.

3. The system of claim 2, wherein the inspection system comprises an EUV photomask inspection system.

4. The system of claim 3, wherein the stage comprises a mask stage.

5. The system of claim 1, wherein the light source is configured to generate deep ultraviolet (DUV) light.

6. The system of claim 5, wherein the inspection system comprises a DUV wafer inspection system.

7. The system of claim 6, wherein the stage comprises a wafer stage.

8. The system of claim 1, wherein the light source is configured to illuminate the stage- level reflective mask grating with incident light having full NA of the imaging sub-system.

9. The system of claim 1, wherein the stage-level reflective mask grating structure is configured to generate a set of coherent diffracted copies of incoherent light NA.

10. The system of claim 1, wherein the detector-level reflective mask grating structure includes more grating elements than the stage-level reflective mask grating structure.

11. The system of claim 1, wherein the grating pitch of the detector-level reflective mask grating structure is upscaled by the magnification ratio of the imaging optics.

12. The system of claim 1, wherein the detector-level reflective mask grating structure is disposed within a free area of the detector plane.

13. The system of claim 1, wherein the one or more sensors comprise one or more charge coupled devices.

14. The system of claim 13, wherein a projection of the pupil image on the one or more charged coupled devices extends across two or more pixels of the one or more charge coupled devices.

15. The system of claim 1, wherein the optical element comprises a mirror.

16. The system of claim 15, wherein the mirror comprises a spherical mirror.

17. The system of claim 16, wherein the spherical mirror has a focal length corresponding to a track length of the imaging sub-system.

18. The system of claim 1, wherein the actuator comprises a shutter positioned between the detector-level reflective mask grating structure and the one or more sensors of the detector to block a reflected pattern from a beam path during normal inspection mode and pass through light during wave front detection mode.

19. The system of claim 1, wherein the actuator comprises a tilt actuator configured to tilt the mirror such that light reflected from the mirror impinges on the one or more sensors of the detector during wave front detection mode and tilt the mirror such that light reflected from the mirror fails to impinge on the one or more sensors of the detector during normal inspection mode.

20. A method of in-situ wavefront metrology of extreme ultraviolet (EUV) light of a photomask inspection system comprising:
    generating EUV light;
    directing the EUV light to a stage-level reflective mask grating disposed on a mask stage;
    directing EUV light reflected from the stage-level reflective structure through an optical imaging system to a detector-level mask structure disposed in a plane of one or more sensors of a detector;
    collecting, with an optical element, EUV light reflected from the detector-level mask structure, forming a pupil image on the one or more sensors of the detector;

laterally shifting the stage-level reflective mask, with the mask stage, across a grating period of the stage-level reflective mask grating structure to provide phase reconstruction for lateral shearing interferometry to identify changes of the wave front of the EUV light of the photomask inspection system; and selectively impinging EUV light reflected from the optical element on the one or more sensors of the detector.

21. A method of in-situ wavefront metrology of light of a deep ultraviolet (DUV) wafer inspection comprising:

generating DUV light;

directing the DUV light to a stage-level reflective mask grating structure disposed on a wafer stage;

directing DUV light reflected from the stage-level reflective structure through an optical imaging system to a detector-level mask grating structure disposed in a plane of one or more sensors of a detector;

collecting, with an optical element, DUV light reflected from the detector-level mask structure, forming a pupil image on the one or more sensors of the detector;

laterally shifting the stage-level reflective mask, with the wafer stage, across a grating period of the stage-level reflective mask grating structure to provide phase reconstruction for lateral shearing interferometry to identify changes of the wave front of the DUV light of the wafer inspection system; and selectively impinging DUV light reflected from the optical element on the one or more sensors of the detector.

* * * * *